(12) United States Patent
Lvovsky

(10) Patent No.: US 7,489,131 B2
(45) Date of Patent: Feb. 10, 2009

(54) SYSTEM AND APPARATUS FOR DIRECT COOLING OF GRADIENT COILS

(75) Inventor: Yuri Lvovsky, Florence, SC (US)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 11/738,786

(22) Filed: Apr. 23, 2007

(65) Prior Publication Data

US 2008/0259560 A1 Oct. 23, 2008

(51) Int. Cl.
*G01V 3/00* (2006.01)
(52) U.S. Cl. ........................... 324/307; 324/300
(58) Field of Classification Search ......... 324/300–322; 600/407–455

See application file for complete search history.

(56) References Cited

U.S. PATENT DOCUMENTS

| | | | |
|---|---|---|---|
| 4,516,404 A * | 5/1985 | Laskaris | 62/51.1 |
| 6,011,394 A * | 1/2000 | Petropoulos et al. | 324/318 |
| 6,236,207 B1 | 5/2001 | Arz et al. | |
| 6,825,664 B2 * | 11/2004 | Kwok et al. | 324/318 |
| 6,909,283 B2 * | 6/2005 | Emeric et al. | 324/300 |
| 6,980,001 B2 * | 12/2005 | Paley et al. | 324/318 |
| 7,015,692 B2 * | 3/2006 | Clarke et al. | 324/300 |
| 2001/0019266 A1 | 9/2001 | Nerreter | |

FOREIGN PATENT DOCUMENTS

| | | |
|---|---|---|
| GB | 2342986 A | 4/2000 |
| GB | 2364572 A | 1/2002 |

OTHER PUBLICATIONS

GB Search Report dated Jul. 10, 2008.

* cited by examiner

*Primary Examiner*—Brij B Shrivastav

(57) ABSTRACT

A system for cooling a gradient coil assembly of a magnetic resonance imaging (MRI) system includes a gradient coil having a first surface comprising a plurality of conductors and a plurality of inter-turn channels. Each inter-turn channel is located between turns of the plurality of conductors. The system also includes a seal layer applied to the first surface of the gradient coil to seal the inter-turn channels. The inter-turn channels are configured to transport a cooling fluid. Alternatively, at least one cooling tube may be located in the inter-turn channels of the gradient coil in order to transport a cooling fluid.

17 Claims, 5 Drawing Sheets

SYSTEM AND APPARATUS FOR DIRECT COOLING OF GRADIENT COILS

FIELD OF THE INVENTION

The present invention relates generally to a magnetic resonance imaging (MRI) system and in particular to a system and apparatus for direct cooling of a gradient coil or coils in a MRI system.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

During a patient scan, the gradient coil(s) of the gradient coil assembly that produce the magnetic field gradients dissipate large amounts of heat. A cooling system or apparatus may be provided to remove the heat generated by the gradient coils. The maximum attainable performance of a gradient coil may be limited by the heat removal capability of the cooling system or systems used. With modern high power MRI imaging sequences, it is increasingly difficult to remove the larger levels of heat generated by the gradient coils. In addition, imposed limits on the temperature rise inside a gradient coil and on the resulting temperature elevation in the patient bore during scanning may result in duty cycle limitations for aggressive imaging sequences.

The gradient coil assembly used in an MRI system may be a shielded gradient coil assembly that consists of inner and outer gradient coil assemblies bonded together with a material such as epoxy resin. Typically, the inner gradient coil assembly includes inner (or main) coils of X-, Y- and Z-gradient coil pairs or sets and the outer gradient coil assembly includes the respective outer (or shielding) coils of the X-, Y- and Z-gradient coil pairs or sets. The Z-gradient coils are typically cylindrical with a conductor spirally wound around the cylindrical surface (or mandrel). The transverse X- and Y-gradient coils are commonly formed from a copper panel with an insulating backing layer. A conductor turn pattern (e.g., a fingerprint pattern) may be cut in the copper layer which leaves an interturn spacing (or gap) between the adjacent turns.

One prior cooling system includes using a hollow conductor for the main Z-gradient coil located on the outside of the inner gradient coil assembly. A cooling fluid may then be passed through the hollow Z-conductor to remove heat generated by the gradient coil assembly. Such a cooling arrangement, however, does not provide direct cooling to the transverse X- and Y-gradient coils of the inner gradient coil assembly. Typically, heat generated by the transverse X- and Y-gradient coils must be transferred to the hollow Z-gradient coil via insulation layers between the gradient coils of the inner gradient coil assembly. The heat transfer may be limited, therefore, by the thermal resistance of the insulation layer material (e.g., glass-epoxy resin).

In order to provide additional cooling, a dedicated cooling channel or channels may be provided on, for example, an inside diameter of the inner gradient coil assembly. Another option for providing additional cooling is using a hollow conductor for the transverse X-gradient coil of the inner gradient coil assembly. Additional dedicated cooling channels or additional hollow inner gradient coils, however, increase the radial space of the gradient coil assembly and also move the main X-, Y- and Z-gradient coils to positions at larger radii. These may result in reduced gradient strength for the gradient coil assembly.

There is a need, therefore, for a gradient coil cooling system that allows for the removal of heat and for the control of the temperature rise inside the gradient coil without the addition of radial space to the gradient coil assembly.

BRIEF DESCRIPTION OF THE INVENTION

In accordance with an embodiment, a system for cooling a gradient coil assembly of a magnetic resonance imaging (MRI) system includes a gradient coil having a first surface comprising a plurality of conductors and a plurality of inter-turn channels, each inter-turn channel located between turns of the plurality of conductors and a seal layer applied to the first surface of the gradient coil to seal the inter-turn channels, wherein the inter-turn channels are configured to transport a cooling fluid.

In accordance with another embodiment, an apparatus for cooling a gradient coil in a gradient coil assembly of a magnetic resonance imaging (MRI) system, the gradient coil having a first surface with a plurality of conductors and a plurality of inter-turn channels between turns of the plurality of conductors, includes at least one cooling tube located in the inter-turn channels of the gradient coil, the at least one cooling tube configured to transport a cooling fluid.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
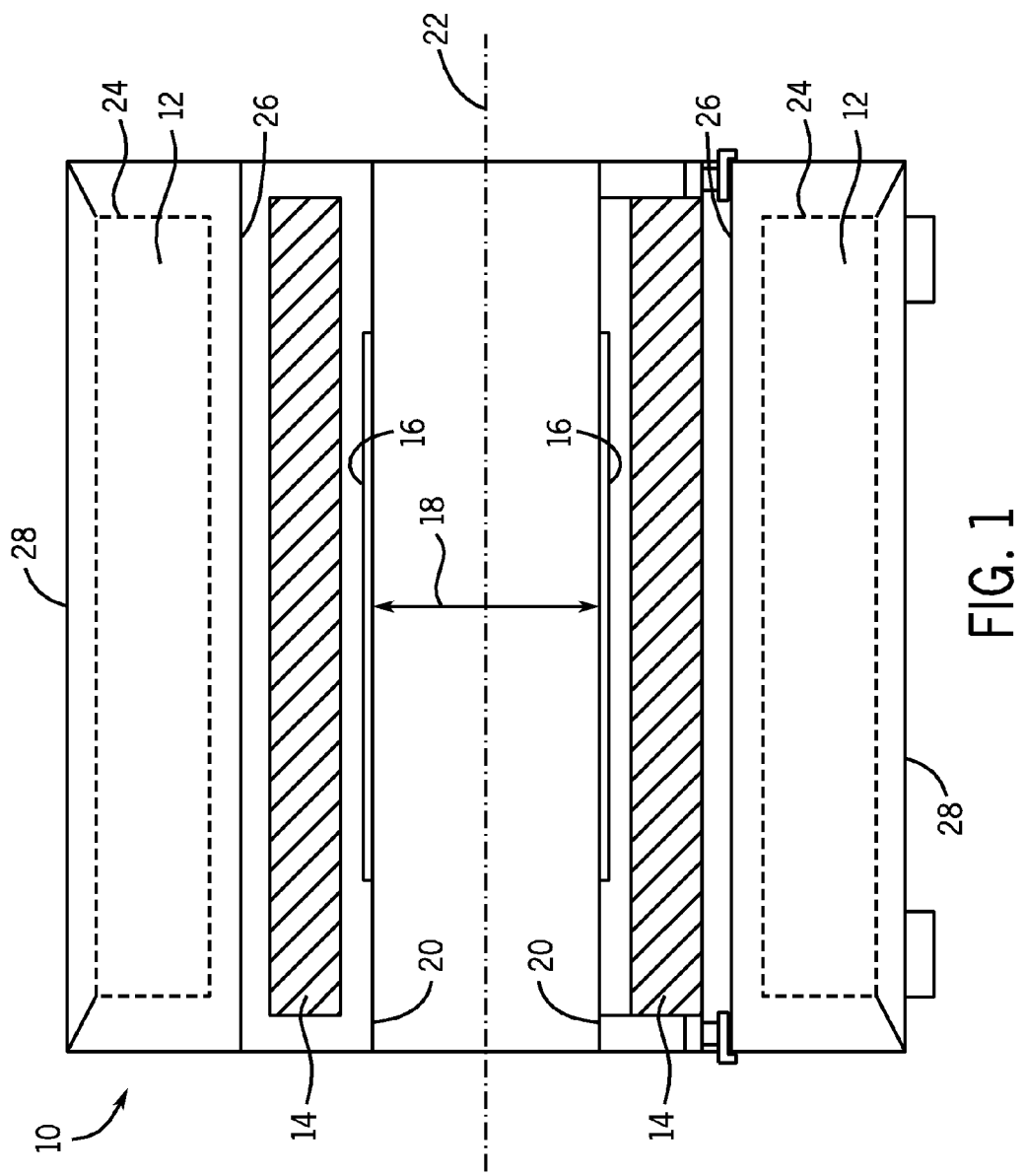
FIG. 1 is a schematic cross-sectional side elevation view of an exemplary magnet assembly in accordance with an embodiment.

FIG. 1 is a schematic cross-sectional side elevation view of an exemplary magnet assembly in accordance with an embodiment. Magnet assembly 10 is cylindrical and annular in shape and may be used in a magnetic resonance imaging (MRI) system for obtaining MR images. Magnet assembly 10 includes, among other elements, a superconducting magnet 12, a gradient coil assembly 14 and an RF coil 16. Various other elements, such as magnet coils, cryostat elements, supports, suspension members, end caps, brackets, etc. are omitted from FIG. 1 for clarity. A cylindrical patient volume or space 18 is surrounded by a patient bore tube 20. RF coil 16 is mounted on an outer surface of the patient bore tube 20 and mounted inside the gradient coil assembly 14. The gradient coil assembly 14 is disposed around the RF coil 16 in a spaced apart coaxial relationship and the gradient coil assembly 14 circumferentially surrounds the RF coil 16. Gradient coil assembly 14 is mounted inside magnet 12 and is circumferentially surrounded by magnet 12.

A patient or imaging subject (not shown) may be inserted into the magnet assembly 10 along a center axis 22 on a patient table or cradle (not shown). Center axis 22 is aligned along the tube axis of the magnet assembly 10 parallel to the direction of a main magnetic field, $B_0$, generated by the magnet 12. RF coil 16 may be used to apply a radio frequency magnetic field pulse (or a plurality of pulses) to a patient or subject and may be used to receive MR information back from the subject, as is well known in the art of MR imaging. Gradient coil assembly 14 generates time dependent gradient magnetic pulses that are used to spatially encode points in the imaging volume 18 in a known manner.

Superconducting magnet 12 may include, for example, several radially aligned and longitudinally spaced-apart superconductive coils (not shown), each capable of carrying a large, identical current. The superconductive coils are designed to create a magnetic field, $B_0$, of high uniformity within the patient volume 18. Superconducting magnet 12 is enclosed in a cryogenic environment within a cryogenic envelope 24 designed to maintain the temperature of the superconductive coils below the appropriate critical temperature so that the coils are in a superconducting state with zero resistance. Cryogenic envelope 24 may include, for example, a helium vessel and thermal shields for containing and cooling the magnet windings in a known manner. Superconducting magnet 12 and cryogenic envelope 24 are enclosed by a magnet vessel 28, e.g., a cryostat vessel. Magnet vessel 28 maintains a vacuum and also prevents heat from being transferred to the cryogenic envelope 24 and superconducting magnet 12. A warm bore 26 is defined by an inner cylindrical surface of the magnet assembly 10.

Figure 2:
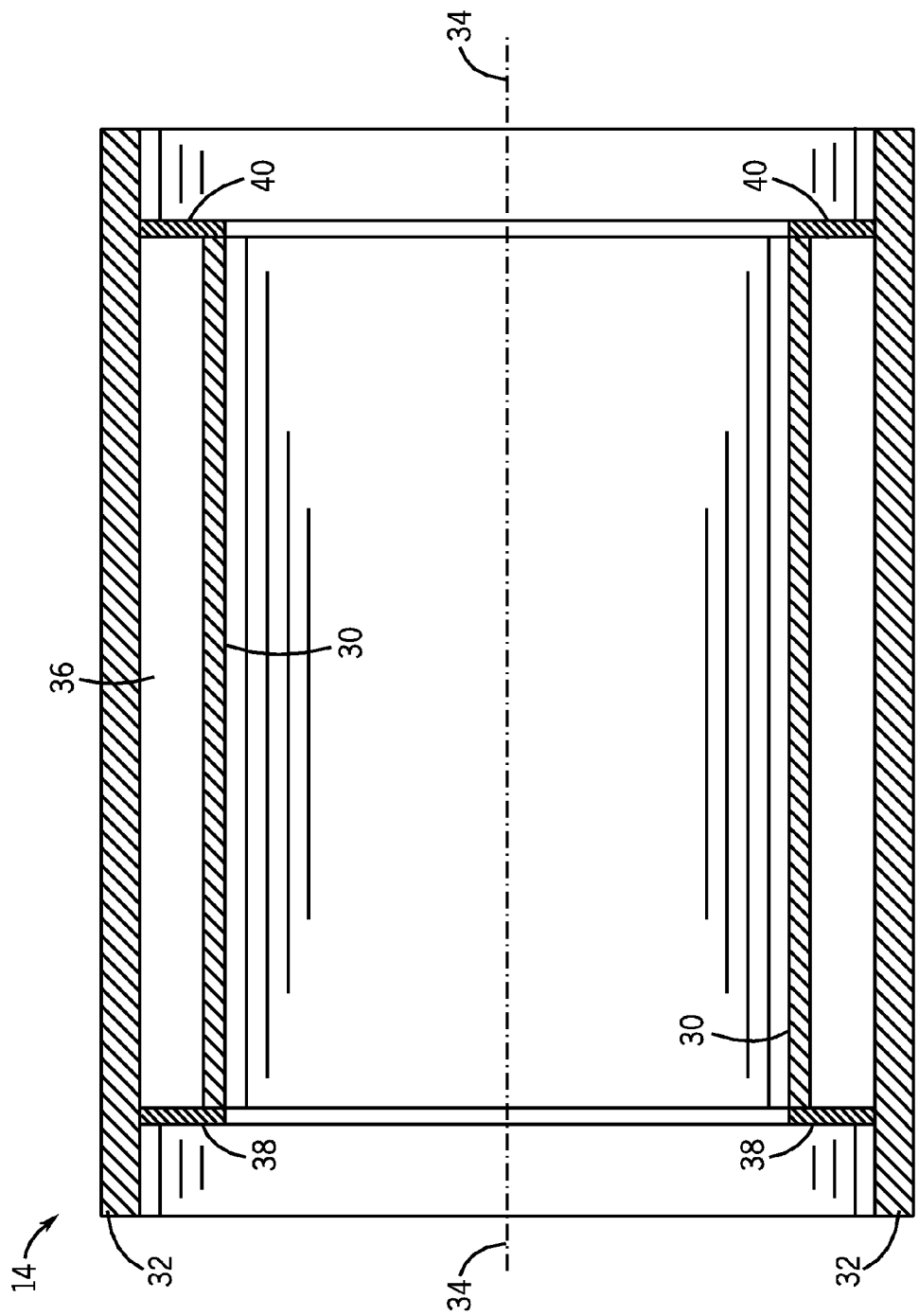
FIG. 2 is a sectional view, taken in a plane through a central longitudinal axis, of an exemplary MR gradient coil set assembly in accordance with an embodiment.

Gradient coil assembly 14 may be a self-shielded gradient coil assembly. FIG. 2 is a sectional view, taken in a plane through a central longitudinal axis of a shielded MR gradient coil assembly in accordance with an embodiment. Gradient coil assembly 14 comprises a cylindrical inner gradient coil assembly or winding 30 and a cylindrical outer gradient coil assembly or winding 32 disposed in concentric arrangement with respect to a common axis 34. Inner gradient coil assembly 30 includes inner coils of X-, Y- and Z-gradient coils and outer gradient coil assembly 32 includes the respective outer coils of the X-, Y- and Z-gradient coils. Gradient coil assembly 14 may be inserted into the bore of a main magnet (such as magnet 12 shown in FIG. 1) of an MRI system so that axis 34 aligns with the bore axis of the main magnet. The coils of gradient coil assembly 14 may be activated by passing an electric current through the coils to generate a gradient field in the bore as required in MR imaging.

A volume 36 of space between inner gradient coil assembly 30 and outer gradient coil assembly 32 may be filled with a bonding material, e.g., epoxy resin, visco-elastic resin, polyurethane, etc. Alternatively, an epoxy resin with filler material such as glass beads, silica and alumina may be used as the bonding material. Inner gradient coil assembly 30 and outer gradient coil assembly 32 may be joined at their respective ends to end rings 38 and 40. The end rings 38 and 40 are provided to hold the inner gradient coil assembly 30 and the outer gradient coil assembly 32 in a radially spaced apart coaxial relationship. End rings 38 and 40 may be fixed to the inner gradient coil assembly 30 and the outer gradient coil assembly 32 using fastening devices (not shown) such as brackets, screws, etc. End rings 38 and 40 hold the inner and outer gradient coil assemblies 30 and 32 in the desired spaced apart coaxial relationship while the epoxy (or other bonding material) in volume 36 cures or sets up. After the epoxy has cured, the end rings 38 and 40 are typically removed. It should be understood that magnet and gradient topologies other than the cylindrical assemblies described above with respect to FIGS. 1 and 2 may be used. For example, a flat gradient geometry in a split-open MRI system may also utilize embodiments of the invention as described below.

Figure 3:
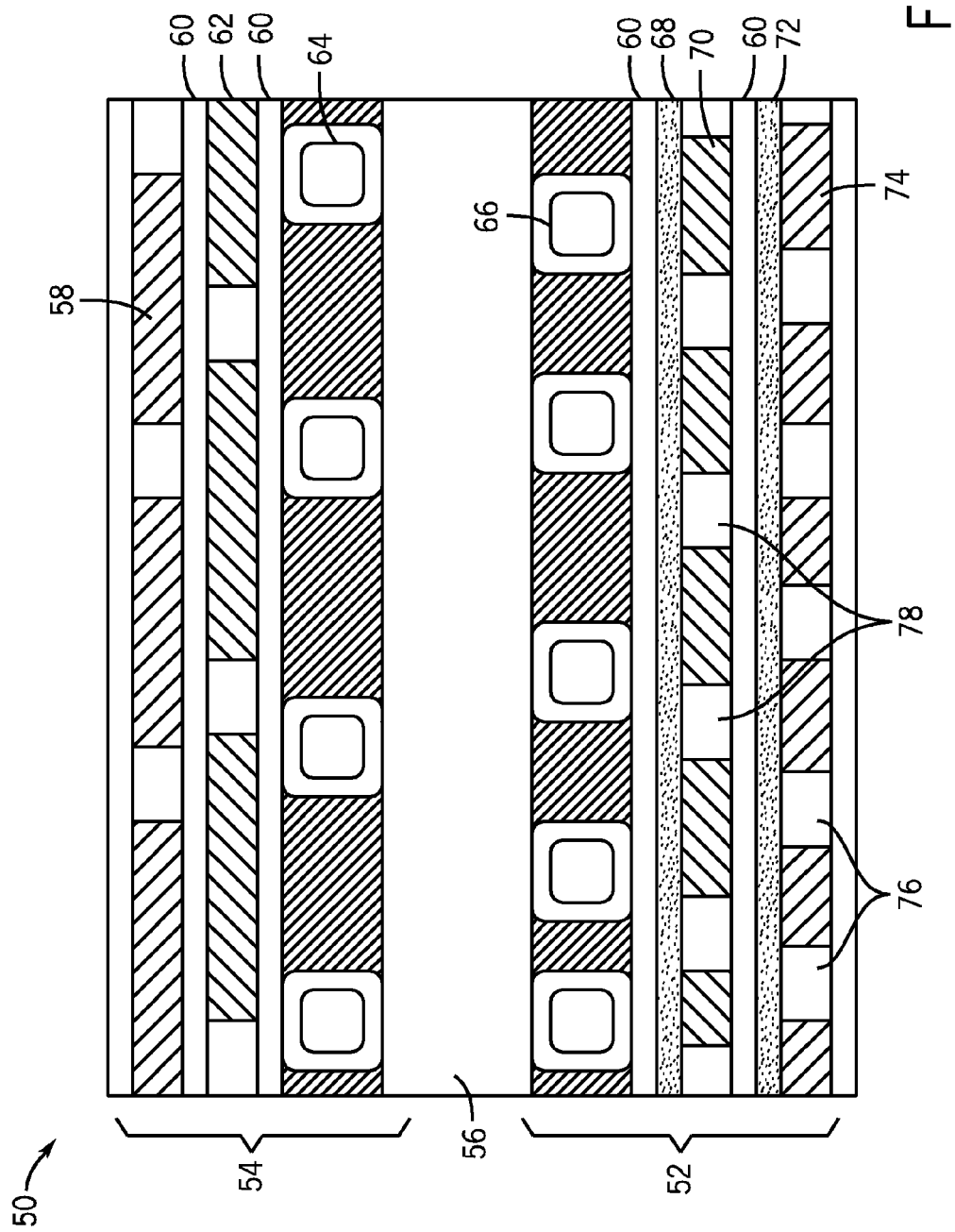
FIG. 3 is a schematic cross-sectional view of a shielded gradient coil assembly stack-up including a cooling system in accordance with an embodiment.

A cooling system or apparatus may be provided to remove the heat generated by the gradient coils of the cylindrical gradient coil assembly 14 or, as mentioned above, the gradient coils utilized in other gradient coil topologies. FIG. 3 is a schematic cross-sectional view of a shielded gradient coil assembly stack-up including a cooling system in accordance with an embodiment. It should be understood that the order of the gradient coils in the stack-up shown in FIG. 3 is exemplary and that the cooling system described herein may be used with other gradient coil orders. In FIG. 3, gradient coil assembly 50 includes an inner gradient coil assembly 52 and an outer gradient coil assembly 54. A bonding material 56, such as epoxy resin, is used to bond the inner gradient coil assembly 52 and the outer gradient coil assembly 54. Preferably, gradient coil assembly 50 is configured to provide the maximum radial separation between the corresponding main and shielding gradient coils. Outer gradient coil assembly 54 comprises a Y-gradient shielding coil 58, an X-gradient shielding coil 62 and a Z-gradient shielding coil 64. The various shielding coils are separated from each other by insulation layers 60 that may be a material such as, for example, glass-epoxy resin. In one embodiment, the Z-gradient shielding coil 64 may be a hollow conductor configured for transporting a coolant, such as, for example, water, ethylene or a propylene-glycol mixture. Alternatively, the Z-gradient coil 64 may be formed from a copper panel.

Inner gradient coil assembly 52 comprises a Z-gradient main coil 66, a Y-gradient main coil 70 and an X-gradient main coil 74. The various main coils are separated from each other by insulation layers 60 that may be a material such as, for example, glass-epoxy resin. Y-gradient main coil 70 includes a copper sheet or board that may be cut (or etched) with a pattern or trace (e.g., a "fingerprint" or "thumbprint" pattern). As a result, a plurality of grooves or inter-turn spaces 78 are created between the individual conductors (or turns) of the Y-gradient main coil 70 that may be used as cooling channels. X-gradient main coil 74 also includes a copper sheet or board that may be cut (or etched) with a pattern or trace (e.g., a "fingerprint" or "thumbprint" pattern). A plurality of grooves or inter-turn spaces 76 are created between the individual conductors (or turns) of the X-gradient main coil 74 that may be used as cooling channels. In one embodiment, the Z-gradient main coil 66 may be a hollow conductor configured to transport a coolant (or cooling fluid). Alternatively, the Z-gradient main coil 66 may be formed from a copper sheet or board with a cut pattern that includes inter-turn grooves that may be used as cooling channels.

The inter-turn grooves 78 of the Y-gradient main coil 70 and the inter-turn grooves 76 of the X-gradient main coil 74 may be used to provide cooling to the inner gradient coil assembly 52. In particular, the inter-turn grooves 78 and 76 of the transverse Y- and X-gradient main coils 70, 74 may be used as cooling channels to provide direct cooling of the transverse Y- and X-gradient main coils. By using the inter-turn grooves 78, 76 as cooling channels, the radial size of the gradient coil assembly may be kept small and a lower radial position of the gradient coils may be maintained. As shown in FIG. 3, the inter-turn grooves 78 and 76 may be sealed and used to transport a coolant (or cooling fluid) such as, for example, water, ethylene or a propylene glycol mixture and the coolant removes heat generated by the transverse gradient coils. Accordingly, the inter-turn grooves 76, 78 are in direct contact with the cooling fluid.

A seal layer 68 may be provided to seal the inter-turn grooves 78 of Y-gradient main coil 70 and a seal layer 72 may be provided to seal the inter-turn grooves 76 of the X-gradient main coil 74. Various methods may be used to create the seal layers 68 and 72. In one embodiment, a sheet of glass-epoxy (e.g., B-stage epoxy-glass prepreg) may be placed on top of the panel coil (e.g., X-gradient main coil 74 and/or Y-gradient main coil 70) and cured before a vacuum pressure impregnation (VPI) process to apply, for example, the insulation layers 60 during fabrication of the gradient coil assembly 50. Alternatively, the seal layers 68, 72 may be created by pre-filling the inter-turn grooves 78, 76 with a solid substance (e.g., tin-lead, plastic, etc.) that has a melting temperature above the maximum temperature to which the gradient coil assembly 50 is subjected during a curing process. The filling substance prevents epoxy impregnated in the gradient coil assembly 50 from filling the grooves 78,76. Once the curing process is complete, a layer of epoxy forms on the top of the filling substance and the copper panel surface. The gradient coil assembly 50 may be heated above the melting temperature of the substance used to fill the inter-turn channels. The filling substance is then melted down and evacuated through the cooling channels. In another embodiment, the seal layer may be formed by a backing board or substrate (e.g., used for backing of the copper sheet or board of the gradient coil) of an adjacent gradient coil. For example, a seal layer for the X-gradient main coil 74 may be formed by a backing board or substrate of the Y-gradient main coil 70.

As mentioned above, the sealed inter-turn grooves 78, 76 may then be used to transport cooling fluid to cool the transverse main gradient coils 70 and 74, respectively. While the cooling system is shown in FIG. 3 implemented in the Y- and X-gradient main coils 70, 74, in another embodiment, the cooling system may be implemented in a Z-gradient main coil 66 formed from a copper panel in a similar manner as the Y- and X-gradient main coils described above.

Figure 4:
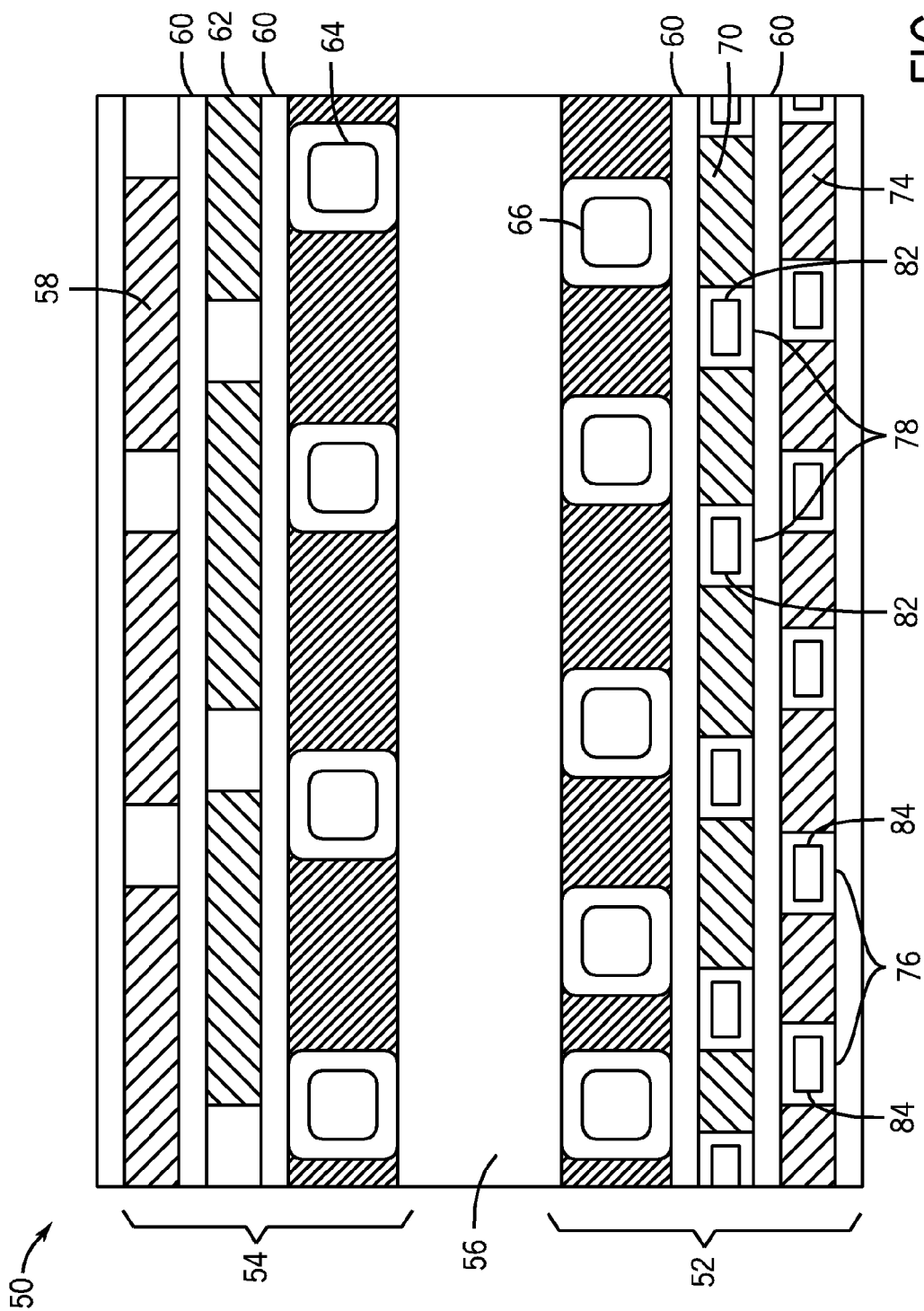
FIG. 4 is a schematic cross-sectional view of a shielded gradient coil assembly stack-up including a cooling system in accordance with an alternative embodiment.

In another embodiment, cooling tubes may be used in the inter-turn grooves as shown in FIG. 4. As mentioned above, the inter-turn grooves 78 of the Y-gradient main coil 70 and the inter-turn grooves 76 of the X-gradient main coils 74 may be used to provide direct cooling to the transverse Y- and X-gradient main coils 70, 74 of the inner gradient coil assembly 52. In the embodiment shown in FIG. 4, a cooling tube 82 may be provided in the inter-turn grooves 78 of the Y-gradient main coil 70. Preferably, cooling tube 82 is an electrically non-conducting thin-walled cooling tube (e.g., fabricated from B-stage glass-epoxy). Cooling tube 82 may be pressed into inter-turn grooves 78 and bonded to the inter-turn grooves 78 with epoxy. A cooling fluid, such as, for example, water, ethylene or a propylene glycol mixture, may be transported via the cooling tube 82 and used to remove heat generated by the transverse Y-gradient main coil 70. A cooling tube 84 may also be provided in the inter-turn grooves 76 of the X-gradient main coil 74. As mentioned above, preferably, cooling tube 84 is an electrically non-conducting thin-walled cooling tube. Cooling tube 84 may be pressed into inter-turn grooves 76 and bonded to the inter-turn grooves with epoxy. A cooling fluid may then be transported via the cooling tube 84 and used to remove heat generated by the transverse X-gradient main coil 74. While the cooling system is shown in FIG. 4 implemented in the Y- and X-gradient main coils 70, 74, in another embodiment, the cooling system may be implemented in a Z-gradient main coil 66 formed from a copper panel in a similar manner as the Y- and X-gradient main coils described above.

Figure 5:
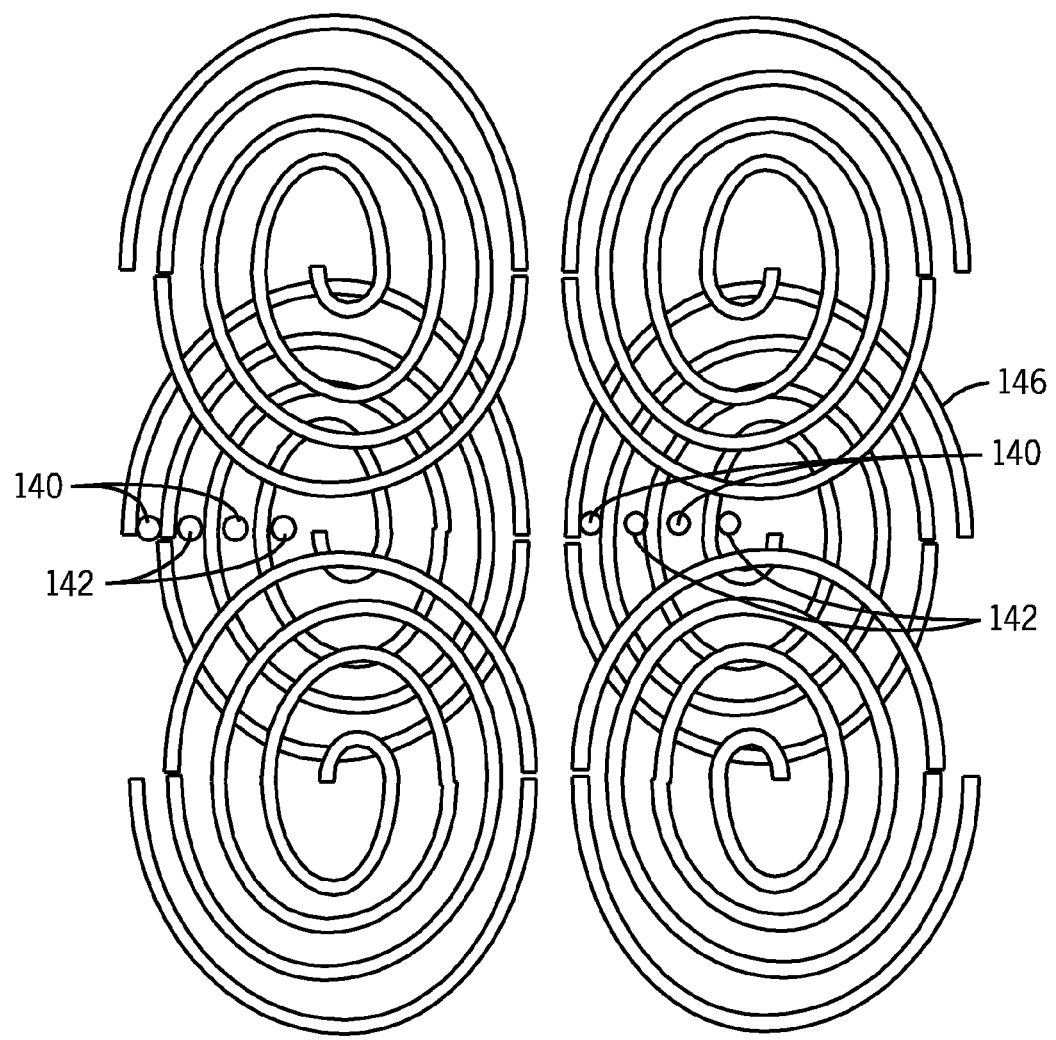
FIG. 5 is a schematic perspective view of exemplary inlet and outlet manifold locations for a gradient coil cooling system in accordance with an embodiment.

The inter-turn grooves 78, 76, shown in FIG. 3, and the cooling tubes 82, 84, shown in FIG. 4, may be coupled to a remote heat exchanger/chiller (not shown) via, for example, coolant feed lines and return lines (not shown). The remote heat exchanger/chiller may be used to direct coolant to the inter-turn grooves 78, 76 (shown in FIG. 3) or to the cooling tubes 82, 84 (shown in FIG. 4) for circulation around the transverse gradient main coils 70, 74. The coolant absorbs heat from the gradient main coils as it is pumped through the inter-turn grooves 78, 76 or cooling tubes 82, 84 and transports the heat to the remote heat exchanger/chiller. The heat may then be, for example, ejected to the atmosphere by way of the heat exchange/chiller. The number of inlet and outlet manifolds to the inter-turn grooves or cooling tubes may be varied to provide the required flow rate, heat transfer coefficient and allowable pressure drop. FIG. 5 is a schematic perspective view of exemplary inlet and outlet manifold locations for a gradient coil cooling system in accordance with an embodiment. Inlet manifold locations 140 and outlet manifold locations 142 may be, for example, within each quarter panel of the X-gradient main coil 146 at 90° and 180° in a gap between the corresponding Y-gradient coil panels. Alternatively, the inlet and outlet manifolds may be positioned between or through the Z-gradient coil turns to the X- and Y-gradient coils. Adjustments to the channel length selection and/or inter-turn spacing can be used to provide a more uniform flow distribution between different inter-turn cooling channels.

In various embodiments, the cooling system may be implemented in one or more of the main gradient coils panels. In other embodiments, the cooling system may be implemented in one or more of the panel gradient coils of the shielding outer gradient coil assembly.

This written description uses examples to disclose embodiments of the invention, including the best mode, and also to enable any person skilled in the art to make and use the invention. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made without departing from the spirit thereof. The scope of these and other changes will become apparent from the appended claims.

What is claimed is:

1. A system for cooling a gradient coil assembly of a magnetic resonance imaging (MRI) system, the system comprising:
   a gradient coil having a first surface comprising a conductor pattern defining a plurality of conductors and defining a plurality of inter-turn channels, each inter-turn channel located between turns of the plurality of conductors;
   a seal layer applied to the conductor pattern on the first surface of the gradient coil to seal the inter-turn channels; and
   a cooling fluid disposed within the inter-turn channels.

2. A system according to claim 1, wherein the gradient coil is a transverse Y-gradient coil.

3. A system according to claim 1, wherein the gradient coil is a transverse X-gradient coil.

4. A system according to claim 1, wherein the gradient coil is a Z-gradient coil.

5. A system according to claim 1, wherein the gradient coil assembly includes an inner gradient coil assembly and an outer gradient coil assembly and the inner gradient coil assembly comprises the gradient coil, the seal layer and the cooling fluid.

6. A system according to claim 1, wherein the gradient coil comprises a copper sheet and the plurality of conductors are cut into a first surface of the copper sheet.

7. A system according to claim 1, wherein the seal layer is fabricated from a glass-epoxy.

8. A system according to claim 1, wherein at least a portion of the seal layer is formed by a backing board of an adjacent gradient coil in the gradient coil assembly.

9. A system according to claim 5, wherein the inner gradient coil assembly further comprises:
   a second gradient coil having a first surface comprising a conductor pattern defining a plurality of conductors and defining a plurality of inter-turn channels, each inter-turn channel located between turns of the plurality of conductors;
   a second seal layer applied to the conductor pattern on the first surface of the second gradient coil to seal the inter-turn channels; and
   a second cooling fluid disposed within the inter-turn channels.

10. An apparatus for cooling a gradient coil in a gradient coil assembly of a magnetic resonance imaging (MRI) system, the gradient coil having a first surface comprising a conductor pattern defining a plurality of conductors and defining a plurality of inter-turn channels between turns of the plurality of conductors, the apparatus comprising:
    at least one cooling tube located in the plurality of inter-turn channels defined by the conductor pattern on the first surface of the gradient coil.

11. An apparatus according to claim 10, wherein the gradient coil is a transverse Y-gradient coil.

12. An apparatus according to claim 10, wherein the gradient coil is a transverse X-gradient coil.

13. An apparatus according to claim 10, wherein the gradient coil is a Z-gradient coil.

14. An apparatus according to claim 10, wherein the at least one cooling tube is bonded to the inter-turn channels using an epoxy.

15. An apparatus according to claim 10, wherein the gradient coil comprises a copper sheet and the plurality of conductors are etched onto a first surface of the copper sheet.

16. An apparatus according to claim 10, wherein the at least one cooling tube is a thin-walled cooling tube.

17. An apparatus according to claim 10, wherein the gradient coil assembly includes a second gradient coil having a first surface comprising a conductor pattern defining a plurality of conductors and defining a plurality of inter-turn channels between turns of the plurality of conductors, the apparatus further comprising at least one second cooling tube located in the plurality of inter-turn channels defined by the conductor pattern on the first surface of the second gradient coil.

* * * * *